United States Patent

Higgins, III

(10) Patent No.: US 9,224,651 B2
(45) Date of Patent: Dec. 29, 2015

(54) METHOD FOR PLATING A SEMICONDUCTOR PACKAGE LEAD

(71) Applicant: Leo M. Higgins, III, Austin, TX (US)

(72) Inventor: Leo M. Higgins, III, Austin, TX (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/219,094

(22) Filed: Mar. 19, 2014

(65) Prior Publication Data

US 2014/0287554 A1    Sep. 25, 2014

Related U.S. Application Data

(62) Division of application No. 13/562,398, filed on Jul. 31, 2012, now Pat. No. 8,716,066.

(51) Int. Cl.
| | |
|---|---|
| *H01L 21/00* | (2006.01) |
| *H01L 21/78* | (2006.01) |
| *H01L 23/00* | (2006.01) |
| *H01L 21/56* | (2006.01) |
| *H01L 23/495* | (2006.01) |
| *H01L 23/31* | (2006.01) |

(52) U.S. Cl.
CPC ............ *H01L 21/78* (2013.01); *H01L 21/561* (2013.01); *H01L 23/49541* (2013.01); *H01L 23/49582* (2013.01); *H01L 24/97* (2013.01); *H01L 23/3107* (2013.01); *H01L 24/16* (2013.01); *H01L 24/32* (2013.01); *H01L 24/48* (2013.01); *H01L 2224/16245* (2013.01); *H01L 2224/32245* (2013.01); *H01L 2224/48091* (2013.01); *H01L 2224/48247* (2013.01); *H01L 2224/73265* (2013.01); *H01L 2224/85444* (2013.01); *H01L 2224/97* (2013.01); *H01L 2924/00014* (2013.01); *H01L 2924/181* (2013.01)

(58) Field of Classification Search
USPC .......... 438/106–114, 123, 458, 460–465, 678
See application file for complete search history.

(56) References Cited

U.S. PATENT DOCUMENTS

| | | | |
|---|---|---|---|
| 6,608,366 B1 | 8/2003 | Fogelson et al. | |
| 7,064,008 B2 | 6/2006 | Abbott et al. | |
| 7,410,834 B2 | 8/2008 | Fukaya et al. | |
| 2006/0154403 A1* | 7/2006 | McLellan et al. | 438/113 |
| 2007/0267736 A1* | 11/2007 | Shimanuki | 257/692 |
| 2007/0269932 A1 | 11/2007 | Abbott et al. | |
| 2008/0246132 A1* | 10/2008 | Kasuya et al. | 257/676 |
| 2011/0042798 A1 | 2/2011 | Pagaila et al. | |
| 2011/0236161 A1 | 9/2011 | Cheng et al. | |

* cited by examiner

*Primary Examiner* — Mary Wilczewski
*Assistant Examiner* — Erik T Peterson

(57) ABSTRACT

A method of forming a packaged semiconductor device includes loading an array of package sites in position for saw singulation, saw singulating the array of package sites, and performing a non-electrolytic plating operation on exposed lead tips of individual packages from the array of package sites as the array of package sites is saw singulated.

15 Claims, 3 Drawing Sheets

METHOD FOR PLATING A SEMICONDUCTOR PACKAGE LEAD

RELATED APPLICATIONS

This is a divisional of U.S. patent application Ser. No. 13/562,398, filed on Jul. 31, 2012, and assigned to the current assignee hereof.

BACKGROUND

1. Field

This disclosure relates generally to semiconductor packaging, and more specifically, to a method for plating a semiconductor package lead.

2. Related Art

In semiconductor packaging, an array of packaged sites may be formed which are subsequently singulated. This singulation may occur by various techniques such as sawing or punching. In this manner, each singulated package has exposed leads to which electrical connections may be made. For example, a singulated packaged can then be surface mounted onto a printed circuit board (PCB). During the surface mount, solder paste may be used to electrically connect the exposed leads to the PCB surface. However, in order to ensure a reliable connection, it is desirable that the solder connections be consistently inspectable visually or with automatic optical inspection.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one embodiment, an array of packaged sites may be singulated by a saw process to form a number of singulated packaged substrates. For example, one such array may be a quad flat no leads (QFN) array. Alternatively, other types of arrays may be singulated by a saw process. Furthermore, the saw process may include a mechanical saw process or a laser saw process. In order to ensure a reliable connection during surface mount of these singulated package substrates, the solder connections should be inspectable visually or with an automatic optical inspection when viewed from the top down. Therefore, in one embodiment, during the saw process itself, a non-electrolytic plating operation is performed on the exposed lead tips to ensure that a wettable surface is formed on the exposed lead tips. In this manner, during subsequent surface mounting, solder paste will wet and mount onto the exposed lead tips on the sides of the packaged device to form a fillet on each exposed lead tip. Due to the plating performed during the saw process, these fillets can be consistently and reliably formed during subsequent surface mount and are capable of being inspected visually or with automatic optical inspection.

Figure 1:
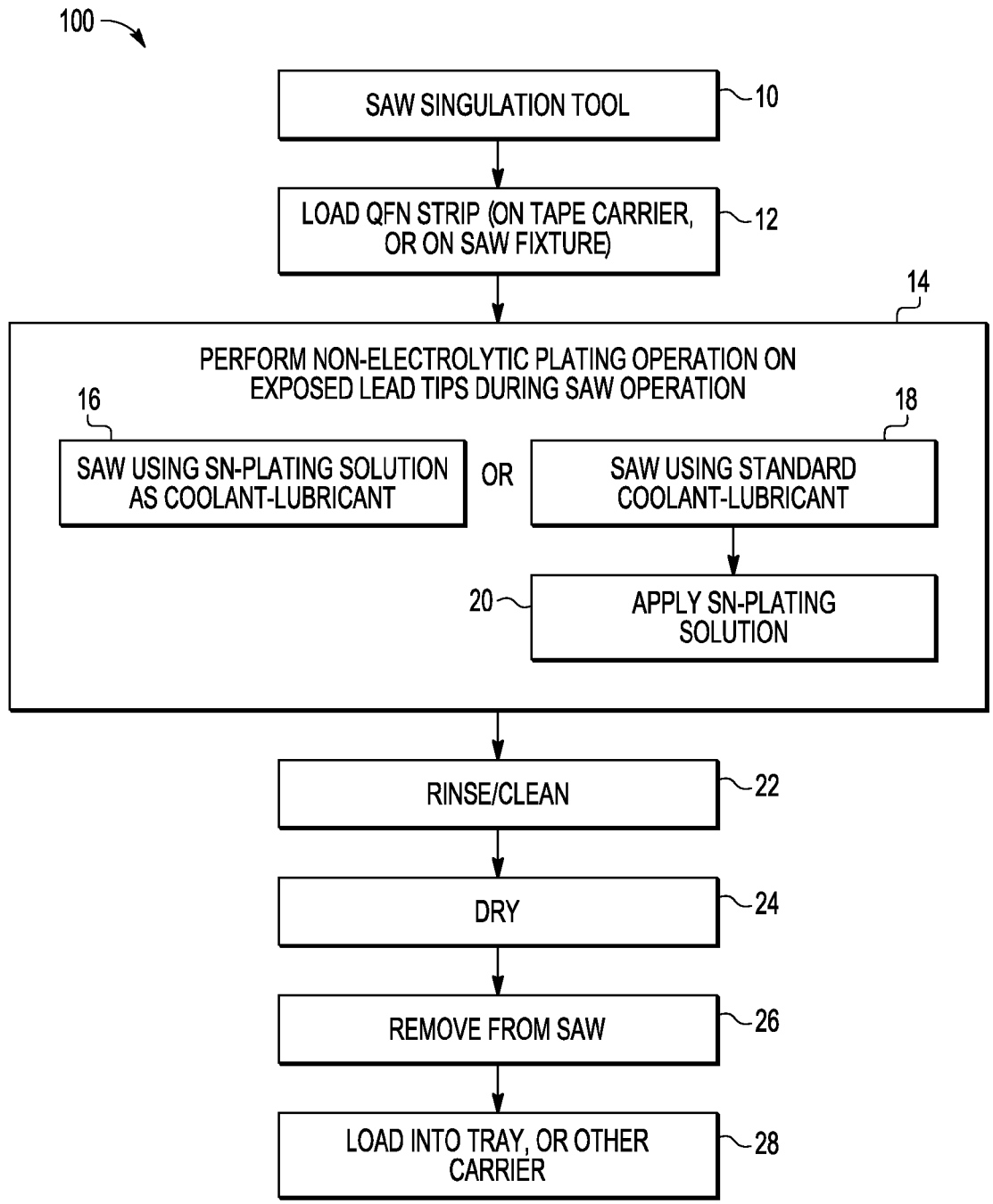
FIG. 1 illustrates, in flow diagram form, a method for forming a semiconductor package in accordance with an embodiment of the present disclosure.

FIG. 1 illustrates a method 100 for forming a packaged semiconductor device in accordance with one embodiment. Method 100 will be described in reference to FIGS. 2 and 3 which illustrate, in cross section form, a portion of an exemplary QFN array, and in reference to FIG. 4 which illustrates a top down view of an exemplary QFN array. Method 100 begins with block 10 in which a saw singulation tool will be used on an array of packaged sites. Therefore, note that each of steps 12, 14, 22, and 24 occur within the saw singulation tool. In one embodiment, this array of packaged sites may be a QFN array, such as illustrated in FIGS. 2, 3 and 4, or may be any other type of saw-singulated array.

Figure 2:
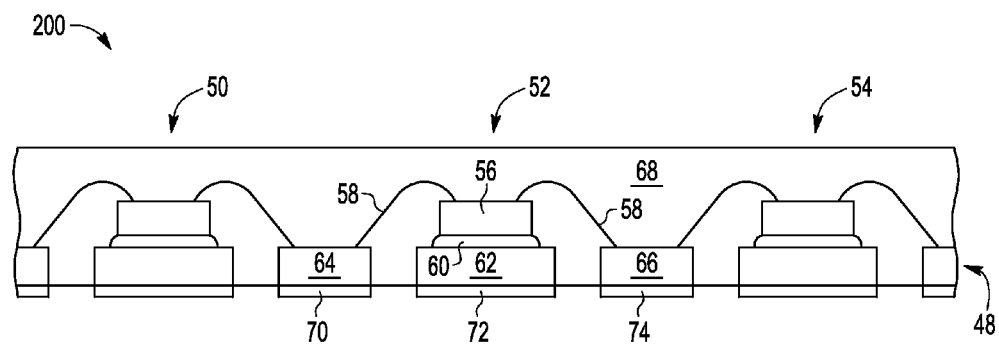
FIG. 2 illustrates, in cross section form, a portion of an array of package sites in accordance with an embodiment of the present disclosure.
Figure 3:
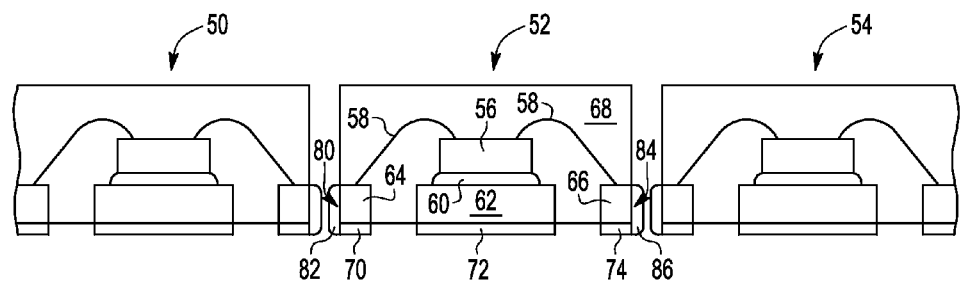
FIG. 3 illustrates, in cross section form, the array of FIG. 2 after a saw process to result in a plurality of singulated semiconductor device packages, in accordance with an embodiment of the present disclosure.

Referring to FIG. 2, FIG. 2 illustrates, in cross section form, a portion of a QFN array 200 formed from a lead frame 48. Array 200 includes a plurality of package sites, such as package sites 50, 52, and 54. Array 200 may be an array N×M package sites in which each of N and M may be an integer value greater than or equal to 1. Each package site, such as exemplary package site 52, includes a semiconductor device, such as exemplary device 56, attached to lead frame 48. Therefore, referring to exemplary package site 52, package site 52 includes semiconductor device 56 attached to a flag 62 of lead frame 48 by way of a die attach material 60. Package site 52 also includes a plurality of leads, such as leads 64 and 66, which, prior to sawing, are each shared by adjacent package sites. Semiconductor device 56 is electrically connected to leads 64 and 66. In the illustrated embodiment, the electrical connections are formed by wire bonds 58. Note that in alternate embodiments, each package site may include multiple semiconductor devices. Array 200 also includes a molding compound 68 which encapsulates all the package sites together. After encapsulation with molding compound 68, lead frame 48 may also be electrolytically plated to form a plating layer on the underside of lead frame 48, such as exemplary plating layer 70, 72, and 74 formed on the underside of lead frame 48 of package site 52. In this case, the plating layer may be a tin plating layer. In an alternate embodiment, lead frame 48 may include a nickel-palladium-gold (or nickel-palladium-gold-silver) plating layer. In this case, the plating layer may completely surround portions of the lead frame 48 and not just be formed on the underside of lead frame 48.

Figure 4:
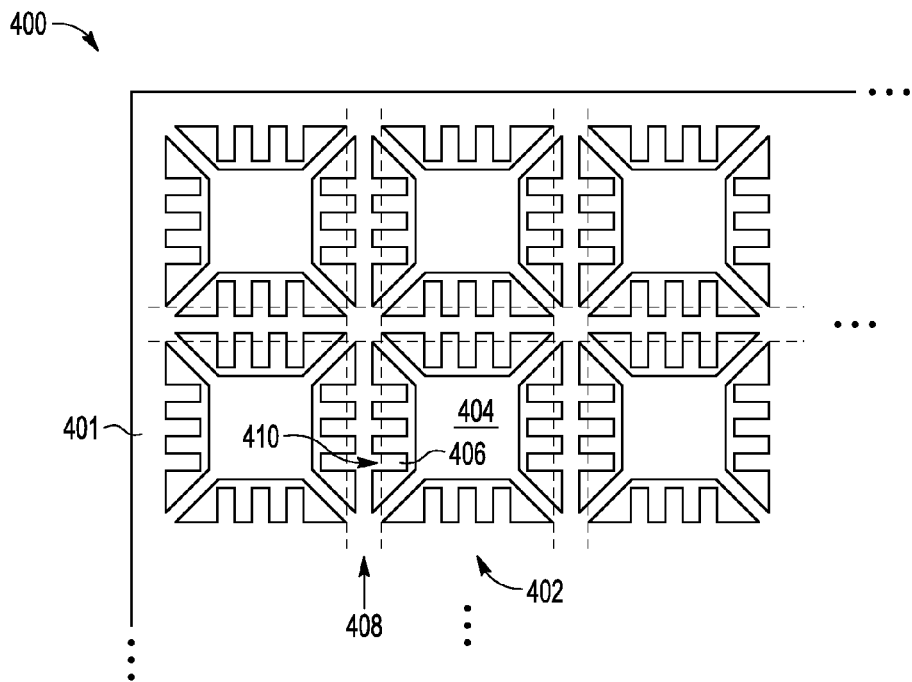
FIG. 4 illustrates a top down view of a portion of a lead frame array in accordance with one embodiment of the present disclosure.

For further clarity, FIG. 4 includes a top down view of an exemplary portion of a lead frame 401 which may be used to form a QFN array or another type of saw-singulated array. Lead frame 401 includes an N×M array of package sites, such as exemplary package site 402, and may correspond to lead frame 48 of FIG. 2. Similarly, package site 402 may correspond to package site 52 of FIG. 2. Exemplary package site 402 includes a flag 404 on which a semiconductor device can be attached, and a plurality of leads, such as exemplary lead 406. Note that flag 404 may correspond to flag 62 of FIG. 2, and exemplary lead 406 may correspond to lead 64 of FIG. 2. The dotted lines in FIG. 4 illustrate the saw streets, such as exemplary saw street 408. The saw process will cut the saw streets so as to singulate each package site from the array. In doing so, each lead, such as lead 406, will have an exposed lead tip resulting from the sawing. For example, location 410 indicates the location of an exposed lead tip of lead 406 which will result when array 400 is sawed along saw street 408 so as to remove the material between the dotted lines designating saw street 408 in FIG. 4.

Referring back to FIG. 1, method 100 proceeds to block 12 in which the array of packaged sites is loaded onto a tape carrier or onto a saw fixture within the saw tool. For example, in one embodiment, array 200 can be placed on a tape carrier which is loaded into the saw tool. During sawing, the tape carrier operates to maintain the package sites in position. Alternatively, no tape carrier may be used. In this case, the saw tool may have a saw fixture on which the array may be placed, along with means to hold the package sites in position during sawing.

Method 100 then proceeds to block 14 in which a non-electrolytic plating operation is performed on exposed lead tips during the saw operation within the saw singulation tool to form a plating layer on the exposed lead tips. For example, referring to FIG. 3, note that, upon singulation, each package site includes exposed lead tips on the minor surfaces of the package sites, such as exemplary exposed lead tips 80 and 84 of package site 52. By applying a non-electrolytic plating operation during the saw operation, a plating layer coats the exposed lead tips, such as exemplary plating layer 82 formed on exposed lead tip 80 and exemplary plating layer 86 formed on exposed lead tip 84 of package site 52. In some embodiments, such as when plating layer 70, 72, and 74 is a tin plating layer, the plating layer formed during saw singulation, such as plating layers 82 and 86, may also coat some or all of previously formed plating layer 70 and 74, respectively.

Referring back to FIG. 1, the non-electrolytic plating operation of block 14 can be performed in accordance with block 16 or in accordance with blocks 18 and 20. Note that in either case, the sawing itself may be formed using either a laser or a mechanical saw. Referring first to block 16, the non-electrolytic plating operation can be performed by using a plating solution as a coolant-lubricant while sawing. In one embodiment, the plating solution is a tin plating solution. However, alternatively, the plating solution can be any metal plating solution that forms a coating on the lead tip that allows fillet formation during surface mount assembly. For example, any metal plating solution which forms a wettable surface for the solder paste formed from the solder paste during surface mounting may be used. Therefore, in block 16, rather than use a standard coolant-lubricant solution during sawing, such as water with a surfactant, the plating solution itself can act as the coolant-lubricant.

Referring now to blocks 18 and 20, the sawing may first be performed using a standard coolant-lubricant, such as a coolant-lubricant which includes water with a surfactant (but without a plating solution). Then, while the package sites remain in position within the saw tool (such as on the tape carrier or within the saw fixture), a plating solution can be applied. As in block 16, the plating solution may be a tin plating solution. However, alternatively, the plating solution can be any metal plating solution that forms a coating on the lead tip that allows fillet formation during surface mount assembly. For example, any metal plating solution which forms a wettable surface for the solder formed from the solder paste during surface mounting may be used.

After block 14, method 100 proceeds to block 22 in which a rinse and clean is performed on the array of package sites, after singulation. Method 100 then proceeds to block 24 in which the array of package sites is dried. Method 100 then proceeds to block 26 in which the singulated array of package sites is removed from the saw singulation tool. Therefore, by the time the array of package sites is removed from the saw singulation tool, the exposed lead tips of each package site has already been coated with a plating layer. That is, the non-electrolytic plating of the exposed lead tips was performed during the saw operation, prior to the array being removed from the saw tool. After block 26, method 100 proceeds to block 28 in which the singulated package sites are loaded into a tray or other carrier for subsequent processing and testing. Therefore, each singulated package site corresponds to a packaged semiconductor device.

Figure 5:
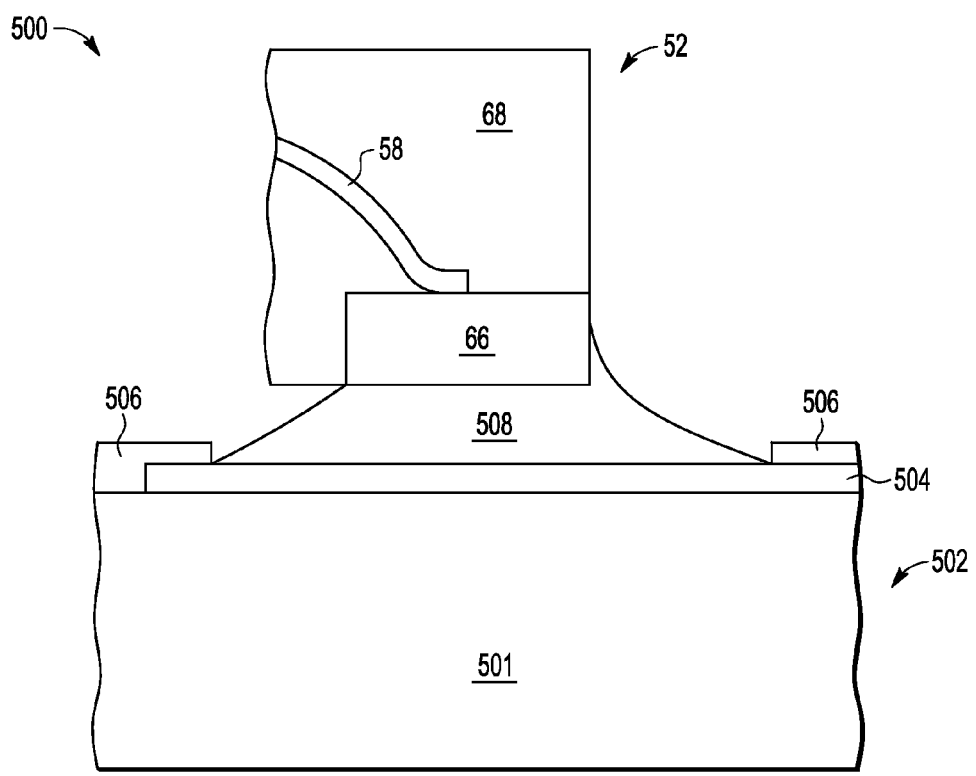
FIG. 5 illustrates, in cross section form, a singulated package site mounted onto a mounting surface in accordance with one embodiment of the present disclosure.

At some later point in processing, a packaged semiconductor device (which may correspond to exemplary singulated package site 52 of FIG. 3) will be surface mounted onto a mounting surface (such as onto a PCB). For example, referring to FIG. 5, singulated package site 52 is mounted onto a mounting surface of a PCB 502. In the illustrated embodiment, PCB 502 includes a PCB substrate 501, a contact 504 over PCB substrate 501, and a passivation layer 506 having an opening exposing contact 504 to which a lead can be attached. In the illustrated portion of FIG. 5, lead 66 is being attached to a PCB contact 504. During this surface mount assembly, a solder paste may be used to attach the leads of the packaged semiconductor device to the PCB. Due to the plating layer which coats the exposed lead tips on the minor surface of the packaged semiconductor device, during the surface mounting, the solder paste will melt and will wet and mount onto these coated exposed lead tips to form a solder fillet 508 on each lead tip. That is, the molten solder from the solder paste will not only wet between the underside major surface of the package semiconductor device and the mounting surface, but will also wet up onto the perpendicular sides to form fillet 508. In this manner, due to the plating layer which coats each exposed lead tip of the packaged semiconductor device, a fillet is reliably formed between each lead of the packaged semiconductor device and the mounting surface. Since these fillets (such as fillet 508) are formed along the sides (perpendicular to the mounting surface), they are capable of being inspected visually or with automatic optical inspection. Note that without the plating of the exposed lead tips, the solder will not reliably wet on the exposed lead tips of a packaged semiconductor device, thus preventing visual or automatic optical inspection of the surface mount assembly to a level sufficient to indicate a pass or fail of the connections between the packaged semiconductor device and the mounting surface.

Therefore, by now it should be understood how the performance of a non-electrolytic plating operation on the exposed lead tips of a package site during the saw operation allows for the consistent and reliable formation of fillets. This, in turn, allows for a surface mount assembly to be inspected by visual inspection or with automatic optical inspection.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, each package site may include more semiconductor devices, and these semiconductor devices can be electrically connected to the lead frame in a variety of ways, such as by wire bond, flip chip, conductive bumps, etc. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

Item 1 includes a method of forming a packaged semiconductor device including loading an array of package sites in position for saw singulation; saw singulating the array of package sites; and performing a non-electrolytic plating operation on exposed lead tips of individual packages from the array of package sites as the array of package sites is saw singulated. Item 2 includes the method of item 1, wherein the array of package sites is a quad flat no-lead (QFN) array. Item 3 includes the method of item 1, wherein a plating solution is used to plate the exposed lead tips and acts as a coolant-lubricant during the saw singulating and plating operations. Item 4 includes the method of item 3, wherein the plating solution is a tin plating solution. Item 5 includes the method of item 3, wherein the plating solution is a metal plating solution that forms a coating on the exposed lead tips and allows formation of a fillet between each of the lead tips and a mounting surface during surface mount assembly on an interconnect substrate. Item 6 includes the method of item 1, and further includes rinsing and drying the singulated array of package sites. Item 7 includes the method of item 1 and further includes removing the singulated array of package sites; and loading the singulated array of package sites into a carrier. Item 8 includes the method of item 1, wherein the loading the array of package sites in position includes loading the array of package sites onto one of the group consisting of: a tape carrier and a saw fixture.

Item 9 includes a method for manufacturing semiconductor packages including saw singulating an array of semiconductor package sites; and non-electrolytically plating sawed edges of the leads on the singulated package sites while the singulated package sites remain in position for the singulating. Item 10 includes the method of item 9, wherein the saw singulating is performed with a laser. Item 11 includes the method of item 9, wherein the saw singulating is performed with a mechanical saw. Item 12 includes the method of item 9, wherein the array of package sites is a QFN array. Item 13 includes the method of item 9, wherein a plating solution is used to plate the sawed edges of the leads and acts as a coolant-lubricant during the saw singulating and plating operations. Item 14 includes the method of item 13, wherein the plating solution is a tin plating solution. Item 15 includes the method of item 13, wherein the plating solution is a metal plating solution that forms a coating on the sawed edges of the leads and allows formation of a fillet between each of the leads and a mounting surface during surface mount assembly on an interconnect substrate.

Item 16 includes a method for manufacturing semiconductor packages including placing an array of semiconductor package sites in position to be saw singulated; sawing the array of semiconductor package sites into separate package sites; and non-electrolytically plating sawed edges of leads on the separate package sites while the separate package sites remain in position for the sawing. Item 17 includes the method of item 16, wherein the sawing is performed with one of the group consisting of: a laser and a mechanical saw. Item 18 includes the method of item 16, wherein the placing the array of package sites in position includes loading the array of package sites onto one of the group consisting of: a tape carrier and a saw fixture. Item 19 includes the method of item 16, wherein a plating solution is used to plate the sawed edges of the leads and acts as a coolant-lubricant during the sawing. Item 20 includes the method of item 19, wherein a plating solution is used to plate the sawed edges of the leads, and the plating solution is a metal plating solution that forms a coating on the sawed edges of the leads and allows formation of a fillet between each of the leads and a mounting surface during surface mount assembly on an interconnect substrate.

What is claimed is:

1. A method for manufacturing semiconductor packages comprising:
   saw singulating an array of semiconductor package sites in a saw tool, wherein the saw singulating results in fully singulated semiconductor packages, wherein each singulated semiconductor package includes exposed leads; and
   after the saw singulating, non-electrolytically plating the exposed leads on the singulated semiconductor packages while the singulated semiconductor packages remain in position for the singulating in the saw tool.

2. The method of claim 1, wherein the saw singulating is performed with a laser.

3. The method of claim 1, wherein the saw singulating is performed with a mechanical saw.

4. The method of claim 1, wherein the array of package sites is a QFN array.

5. The method of claim 1, wherein a plating solution is used to plate the sawed edges of the leads.

6. The method of claim 5, wherein the plating solution is a tin plating solution.

7. The method of claim 5, wherein the plating solution is a metal plating solution that forms a coating on the sawed edges of the leads and allows formation of a fillet between each of the leads and a mounting surface during surface mount assembly on an interconnect substrate.

8. The method of claim 1, wherein the non-electrolytically plating the exposed leads results in a plating layer that entirely coats the exposed leads on minor surfaces of the singulated semiconductor packages.

9. A method for manufacturing semiconductor packages comprising:
   placing an array of semiconductor package sites in position to be saw singulated;
   sawing the array of semiconductor package sites into fully singulated packages in a saw tool; and
   after the sawing, non-electrolytically plating sawed edges of leads on the singulated packages while the singulated packages remain in position for the sawing in the saw tool.

10. The method of claim 9, wherein the sawing is performed with one of the group consisting of: a laser and a mechanical saw.

11. The method of claim 9, wherein the placing the array of package sites in position includes loading the array of package sites onto one of the group consisting of: a tape carrier and a saw fixture.

12. The method of claim 9, wherein a plating solution is used to plate the sawed edges of the leads.

13. The method of claim 12, wherein a plating solution is used to plate the sawed edges of the leads, and the plating solution is a metal plating solution that forms a coating on the sawed edges of the leads and allows formation of a fillet between each of the leads and a mounting surface during surface mount assembly on an interconnect substrate.

14. The method of claim 8, wherein the plating layer allows formation of a fillet between each of the leads and a mounting surface during surface mount assembly on an interconnect substrate.

15. The method of claim 9, wherein the non-electrolytically plating the sawed edges of leads results in a plating layer that entirely coats the sawed edges of leads on minor surfaces of the separated packages.

\* \* \* \* \*